(12) United States Patent
Wang et al.

(10) Patent No.: US 12,112,617 B2
(45) Date of Patent: Oct. 8, 2024

(54) DRIVING MECHANISM

(71) Applicant: TDK TAIWAN CORP., Taoyuan (TW)

(72) Inventors: Chao-Hsi Wang, Taoyuan (TW);
Xuan-Huan Su, Taoyuan (TW);
Kuen-Wang Tsai, Taoyuan (TW);
Chao-Chang Hu, Taoyuan (TW)

(73) Assignee: TDK TAIWAN CORP., Taoyuan (TW)

( * ) Notice: Subject to any disclaimer, the term of this patent is extended or adjusted under 35 U.S.C. 154(b) by 59 days.

(21) Appl. No.: 17/882,867

(22) Filed: Aug. 8, 2022

(65) Prior Publication Data
US 2023/0039912 A1    Feb. 9, 2023

Related U.S. Application Data

(60) Provisional application No. 63/230,990, filed on Aug. 9, 2021.

(51) Int. Cl.
| | |
|---|---|
| *H04N 23/55* | (2023.01) |
| *G02B 7/08* | (2021.01) |
| *G03B 5/00* | (2021.01) |
| *G03B 9/40* | (2021.01) |
| *G03B 13/36* | (2021.01) |
| *G08B 6/00* | (2006.01) |
| *H02K 11/21* | (2016.01) |
| *H02K 41/035* | (2006.01) |
| *H04N 23/51* | (2023.01) |
| *H04N 23/54* | (2023.01) |
| *H05K 1/18* | (2006.01) |

(52) U.S. Cl.
CPC ............... *G08B 6/00* (2013.01); *G02B 7/08* (2013.01); *G03B 5/00* (2013.01); *G03B 9/40* (2013.01); *G03B 13/36* (2013.01); *H02K 11/21* (2016.01); *H02K 41/0354* (2013.01); *H04N 23/51* (2023.01); *H04N 23/54* (2023.01); *H04N 23/55* (2023.01); *H05K 1/181* (2013.01); *H05K 2201/10916* (2013.01)

(58) Field of Classification Search
CPC ............... G03B 9/00; G03B 9/06; G03B 9/08
See application file for complete search history.

(56) References Cited

U.S. PATENT DOCUMENTS

| | | | |
|---|---|---|---|
| 2011/0122311 A1* | 5/2011 | Han | H02K 41/0356 348/E3.007 |
| 2016/0274441 A1* | 9/2016 | Yamamoto | G03B 13/34 |
| 2019/0230262 A1* | 7/2019 | Wang | F03G 7/0614 |
| 2020/0409235 A1* | 12/2020 | Zhou | G03B 30/00 |

* cited by examiner

*Primary Examiner* — Noam Reisner
(74) *Attorney, Agent, or Firm* — MUNCY, GEISSLER, OLDS & LOWE, PC

(57) ABSTRACT

A driving mechanism for moving a flat optical element is provided. The driving mechanism includes a fixed part, a movable member, and a driving assembly. The movable member is movably disposed on the fixed part and connected to the optical element. The driving assembly is configured to impel the movable member and the optical element to move relative to the fixed part. The driving assembly has a coil disposed on the fixed part.

16 Claims, 8 Drawing Sheets

DRIVING MECHANISM

BACKGROUND OF THE INVENTION

Field of the Invention

The present invention relates to a driving mechanism, and, in particular, to a driving mechanism configured to move an optical element.

Description of the Related Art

As technology has advanced, a lot of electronic devices (for example, laptop computers and smartphones) have incorporated the functionality of taking photographs and recording video. These electronic devices have become more commonplace, and have been developed to be more convenient and thin. More and more options are provided for users to choose from.

In some electronic devices, it can be difficult to reduce the size of the shutter or aperture mechanism in a camera module. Therefore, addressing the aforementioned problems has become a challenge.

BRIEF SUMMARY OF THE INVENTION

An embodiment of the present invention provides a driving mechanism for moving a flat optical element. The driving mechanism includes a fixed part, a movable member, and a driving assembly. The movable member is movably disposed on the fixed part and connected to the optical element. The driving assembly is configured to impel the movable member and the optical element to move relative to the fixed part, wherein the driving assembly has a coil disposed on the fixed part.

In some embodiments, the driving mechanism further includes a slider that has a hinge pivotally connected to the movable member, wherein the driving assembly further has a magnetic element disposed on the slider, and the hinge and the magnetic element are located on opposite sides of the sider.

In some embodiments, when a current signal is applied to the coil, the coil and the magnetic element generate an electromagnetic force to impel the slider and the magnetic element in a linear direction relative to the coil, and the movable member is forced to rotate relative to the fixed part along a curved path.

In some embodiments, the driving mechanism further includes a yoke disposed on the fixed part and extending through the coil, wherein the coil and the fixed part do not contact each other.

In some embodiments, the polar direction of the magnetic element is perpendicular to a central axis of the coil.

In some embodiments, the linear direction is parallel to the central axis.

In some embodiments, the fixed part has a quadrilateral structure, and the central axis of the coil is angled relative to one side of the quadrilateral structure.

In some embodiments, the coil is located adjacent to a corner of the fixed part.

In some embodiments, the driving mechanism further includes a circuit board, a magnet, and a Hall effect sensor, wherein the magnet is disposed on the movable member, and the Hall effect sensor is disposed on the circuit board, wherein the magnet and the Hall effect sensor are accommodated in an opening of the fixed part.

In some embodiments, the polar directions of the magnetic element and the magnet are parallel to each other.

In some embodiments, the driving mechanism further includes a block disposed on the movable member, wherein the magnet and the block are located on opposite sides of the movable member.

In some embodiments, the driving mechanism further includes two driving assemblies disposed on opposite sides of the movable member.

In some embodiments, the driving assemblies generate two electromagnetic forces in opposite directions.

In some embodiments, the driving assemblies generate two electromagnetic forces in the same direction.

In some embodiments, the driving mechanism is configured to move a plurality of flat optical elements relative to the fixed part, and the fixed part forms a stepped structure and a depressed region adjacent to each other, wherein the optical elements are disposed on the stepped structure and in the depressed region, and the optical elements do not contact each other.

In some embodiments, the driving mechanism is configured to move a plurality of flat optical elements relative to the fixed part, and the optical elements partially overlap when viewed in a vertical direction, wherein the vertical direction is perpendicular to the optical elements.

In some embodiments, the optical elements constitute a C-shaped structure, and an opening is formed between the optical elements.

In some embodiments, the fixed part includes a lower case and an upper case connected to each other, the movable member is received in a recess of the upper case, and the optical element is disposed on the movable member.

In some embodiments, the lower case forms a lower rectangular opening and a lower curved opening, and the upper case forms an upper rectangular opening and an upper curved opening, wherein the lower rectangular opening is communicated with the upper rectangular opening, and the lower curved opening is communicated with the upper curved opening.

In some embodiments, the movable member has a protrusion extending through the optical element.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the driving mechanism are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood by one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

In the following detailed description of the preferred embodiments, reference is made to the accompanying drawings, and in which specific embodiments of which the invention may be practiced are shown by way of illustration. In this regard, directional terminology, such as "top," "bottom," "left," "right," "front," "back," etc., is used with reference to the orientation of the figures being described. The components of the present invention can be positioned in a number of different orientations. As such, the directional terminology is used for the purposes of illustration and is in no way limiting.

Figure 1:
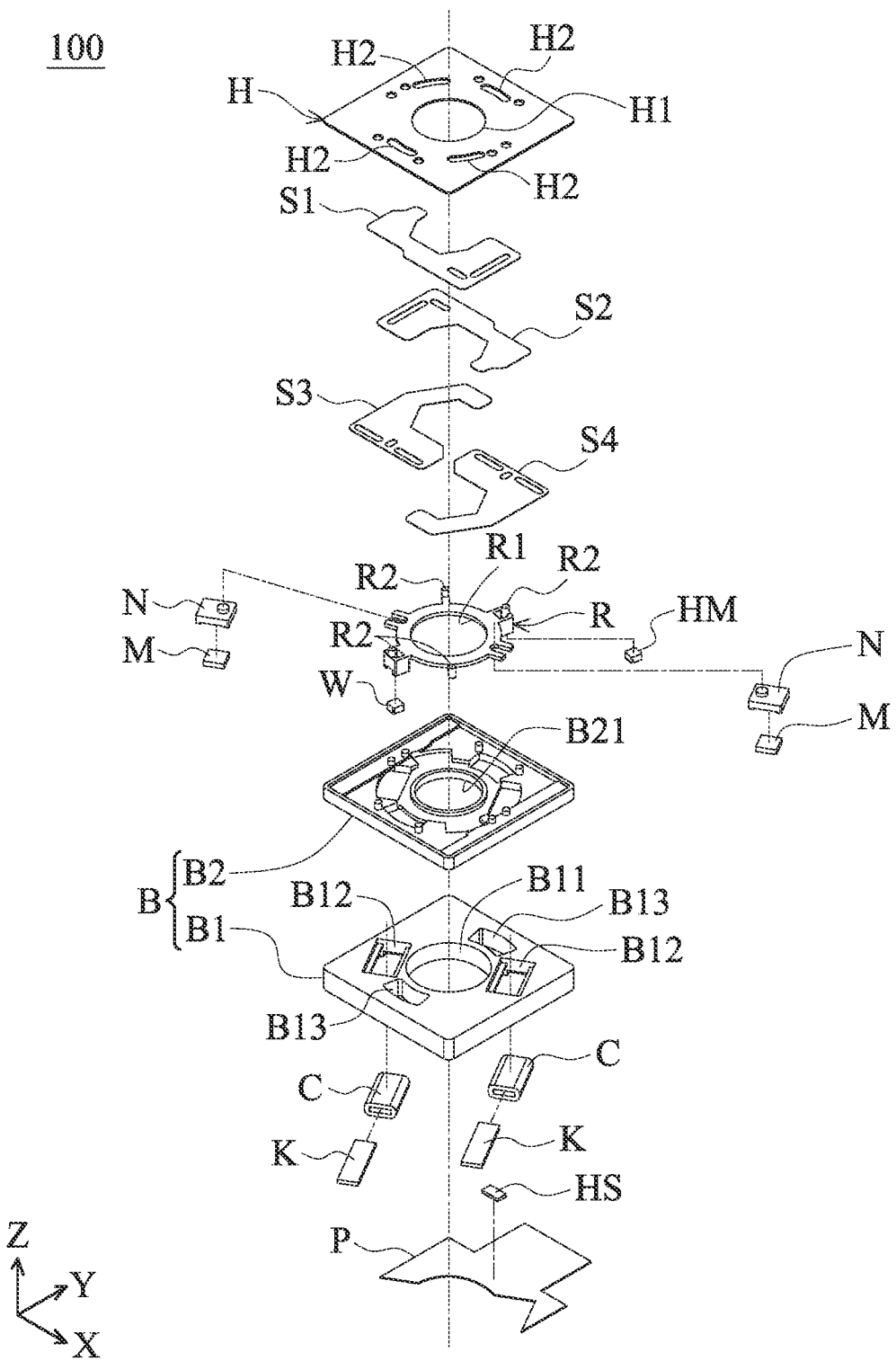
FIG. 1 is an exploded diagram of a driving mechanism 100 in accordance with an embodiment of the invention.
Figure 2:
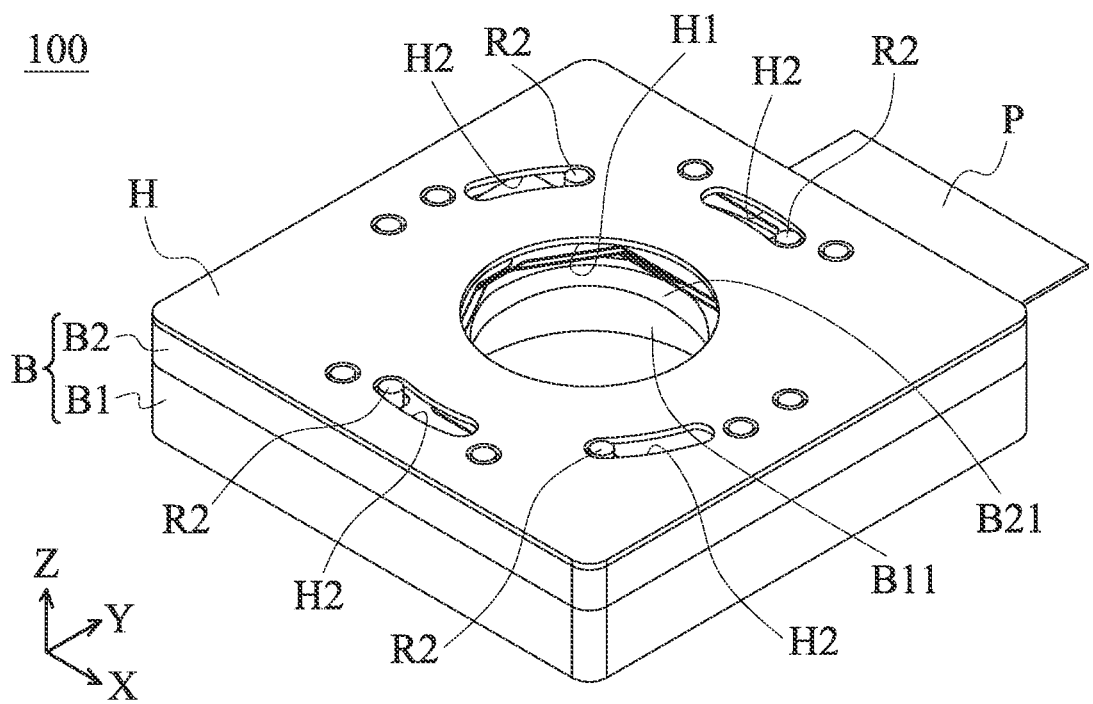
FIG. 2 is a perspective diagram of the driving mechanism 100 in FIG. 1.
Figure 3:
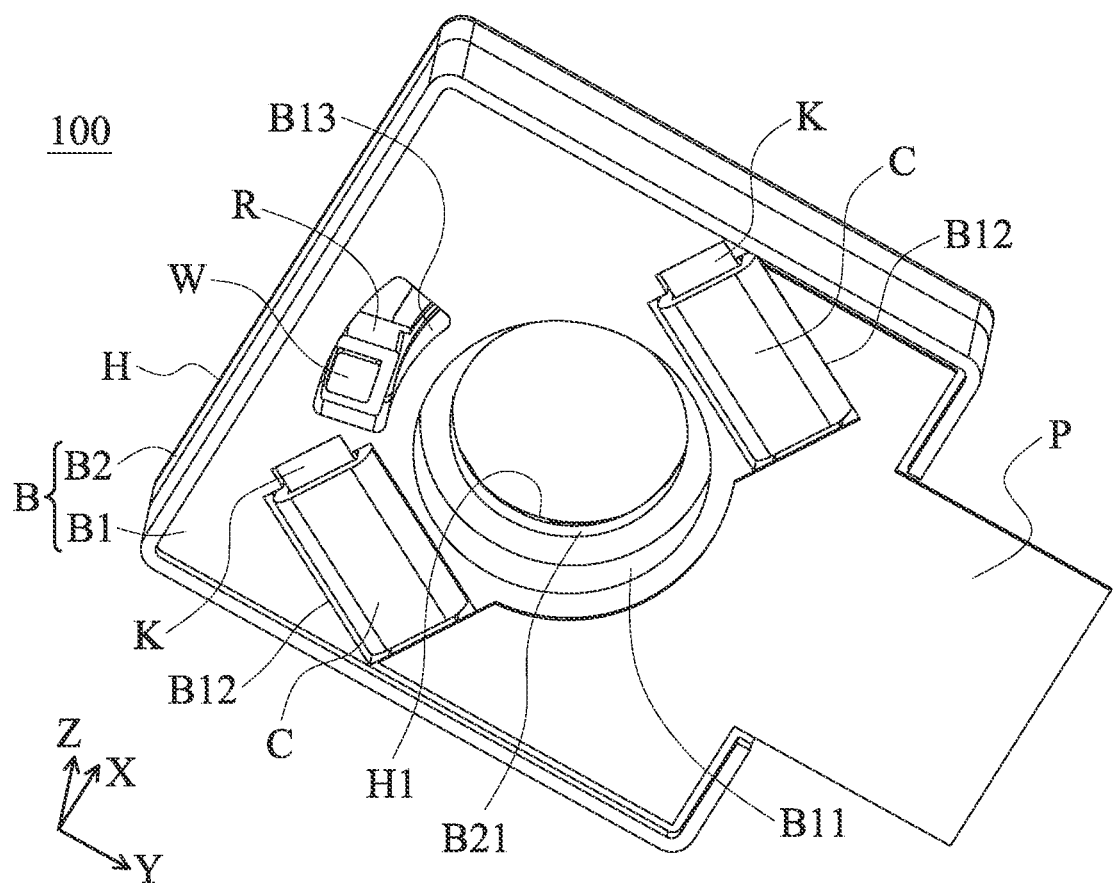
FIG. 3 is another perspective diagram of the driving mechanism 100 in FIG. 1.
Figure 4:
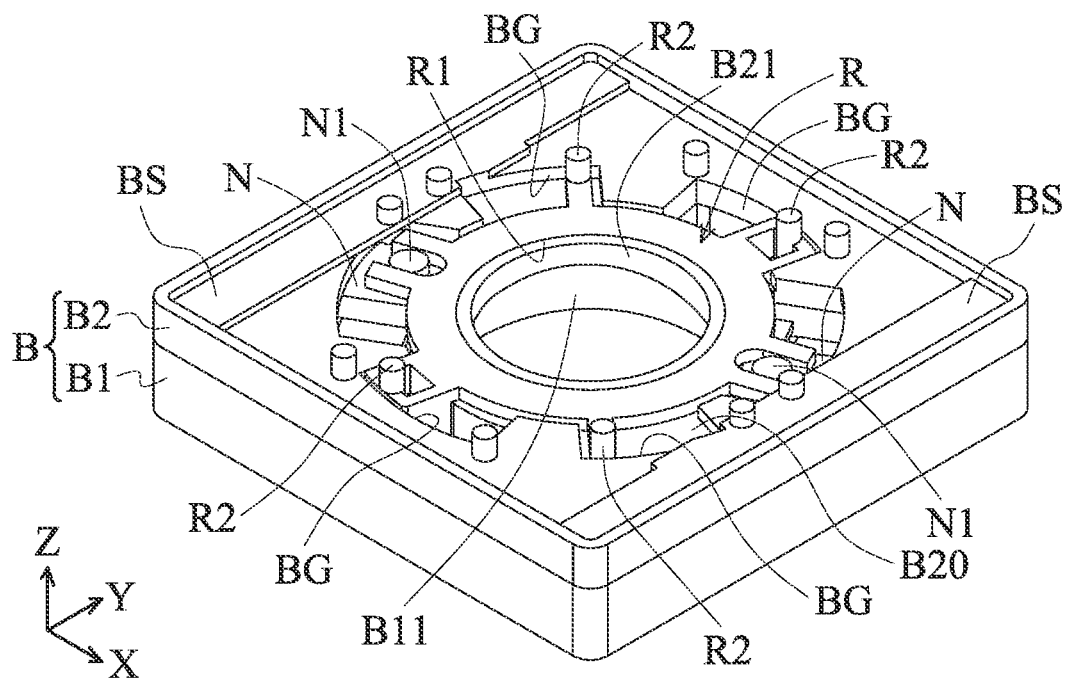
FIG. 4 is a perspective diagram showing the lower case B1, the upper case B2, the slider N, and the movable member R after assembly.
Figure 5:
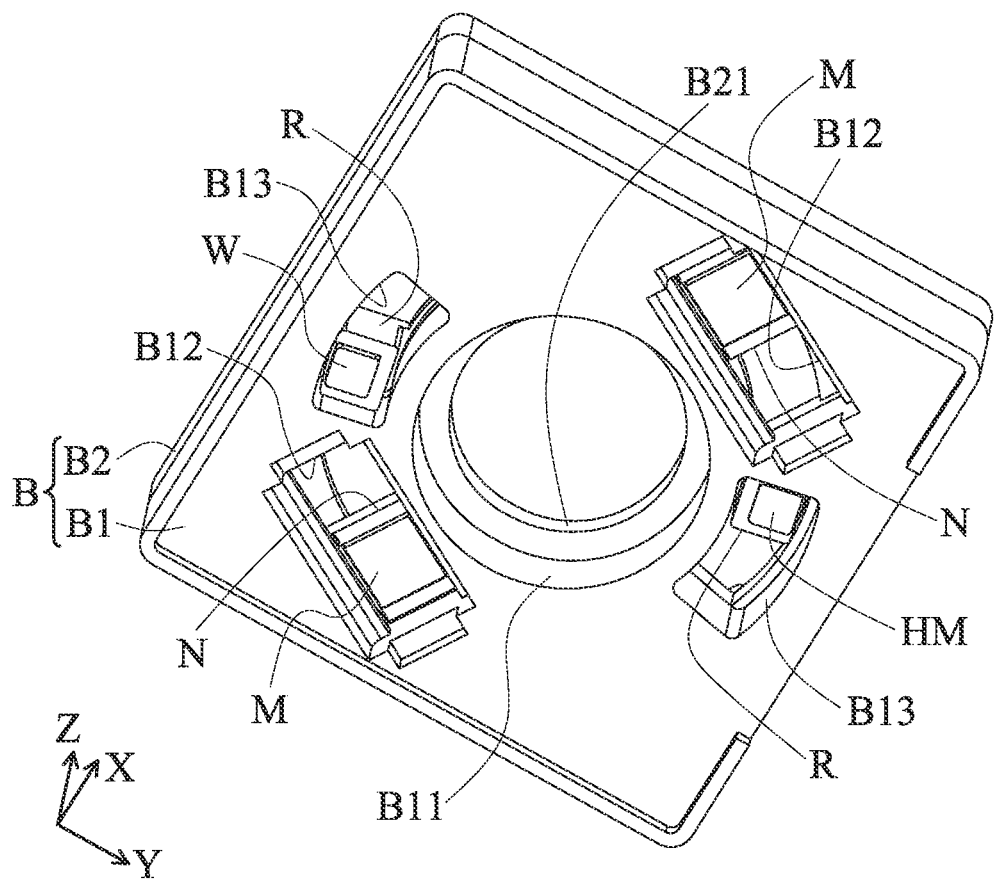
FIG. 5 is a perspective diagram showing the magnetic elements M, the magnet HM, and the block W accommodated in the lower rectangular openings B12 and the lower curved openings B13 of the lower case B1.

FIG. 1 is an exploded diagram of a driving mechanism 100 in accordance with an embodiment of the invention. FIG. 2 is a perspective diagram of the driving mechanism 100 in FIG. 1. FIG. 3 is another perspective diagram of the driving mechanism 100 in FIG. 1. FIG. 4 is a perspective diagram showing the lower case B1, the upper case B2, the slider N, and the movable member R after assembly. FIG. 5 is a perspective diagram showing the magnetic elements M, the magnet HM, and the block W accommodated in the lower rectangular openings B12 and the lower curved openings B13 of the lower case B1.

As shown in FIGS. 1-5, an embodiment of the driving mechanism 100 may be disposed in a cell phone, tablet computer or other electronic devices. The driving mechanism 100 primarily comprises a circuit board P, a fixed part B, a cover H, an annular movable member R, and several flat optical elements S1, S2, S3, and S4. The optical elements S1, S2, S3, and S4 partially overlap when viewed in the Z direction (vertical direction), wherein the Z direction is perpendicular to the optical elements S1, S2, S3, and S4.

The fixed part B includes a lower case B1 and an upper case B2 connected to each other. The circuit board P is affixed to the bottom of the lower case B1. A recess B20 is formed on the top side of the upper case B2 (FIG. 4), wherein the recess B20 has several curved sidewalls BG. The movable member R is slidably disposed in the recess B20 of the upper case B2, and it is rotatable relative to the upper case B2. The cover H is affixed to the top side of the upper case B2 for covering and protecting the optical elements S1, S2, S3, and S4.

The cover H forms a hole H1 and several curved slots H2, and the movable member R forms a hole R1 and several protrusions R2. The protrusions R2 extend through the optical elements S1, S2, S3, and S4 into the slots H2. When the movable member R rotates relative to the upper case B2, the protrusions R2 move in the slots H2 and impel the optical elements S1, S2, S3, and S4 to move relative to the fixed part B along the X axis or the Y axis.

In this embodiment, the optical elements S1, S2, S3, and S4 can be used as camera shutter blades, and they may comprise light shading material to block light from entering the electronic device via the holes H1, R1 of the cover H and the movable member R and the holes B21, B11 of the upper and lower cases B2 and B1 to an image sensor (not shown) inside the electronic device.

Moreover, the driving mechanism 100 further comprises two sliders N, two magnetic elements M, two coils C, two yokes K, a magnet HM, a Hall effect sensor HS, and a block W. The yokes K are respectively disposed through the coils C, and each of the sliders N has a hinge N1 slidably hinged to the movable member R, wherein the two sliders N are located on opposite sides of the movable member R.

The magnetic elements M are affixed to the bottom of the sliders N. When the sliders N and the magnetic elements M are forced to slide along the lower rectangular openings B12 of the lower case B1, the movable member R can be driven to rotate relative to the upper case B2. With the magnetic elements M arranged on opposite sides of the movable member R, weight balance and accurate positioning of the driving mechanism 100 can be therefore achieved.

Specifically, when current signals are applied to the coils C, the coils C and the magnetic elements M can generate electromagnetic forces to impel the movable member R to rotate around the center of the upper case B2. Hence, the optical elements S1, S2, S3, and S4 can be pushed by the movable member R to slide relative to the fixed part B along the X axis or the Y axis (horizontal direction) to open or block the holes H1, R1, B21, and B11, and the driving mechanism 100 can be used as a shutter or aperture of an camera unit in the electronic device.

The magnet HM and the block W are mounted on the bottom side of the movable member R. When the movable member R rotates relative to the upper case B2 along a curved path, the magnet HM and the block W respectively move in the lower curved openings B13 of the lower case B1. As the magnet HM and the block W are arranged on opposite sides of the movable member R, weight balance and accurate positioning of the driving mechanism 100 can be therefore achieved.

In this embodiment, the Hall effect sensor HS is disposed on the circuit board P for detecting the displacement of the magnet HM and the movable member R relative to the upper case B2, thus facilitating rapid and precise positioning control to the optical elements S1, S2, S3, and S4.

In FIGS. 1 and 4, the curved sidewalls BG of the recess B20 are formed on the top side of the upper case B2, wherein the protrusions R2 can slide along the curved sidewalls BG and rotate around the center of the upper case B2.

Figure 6:
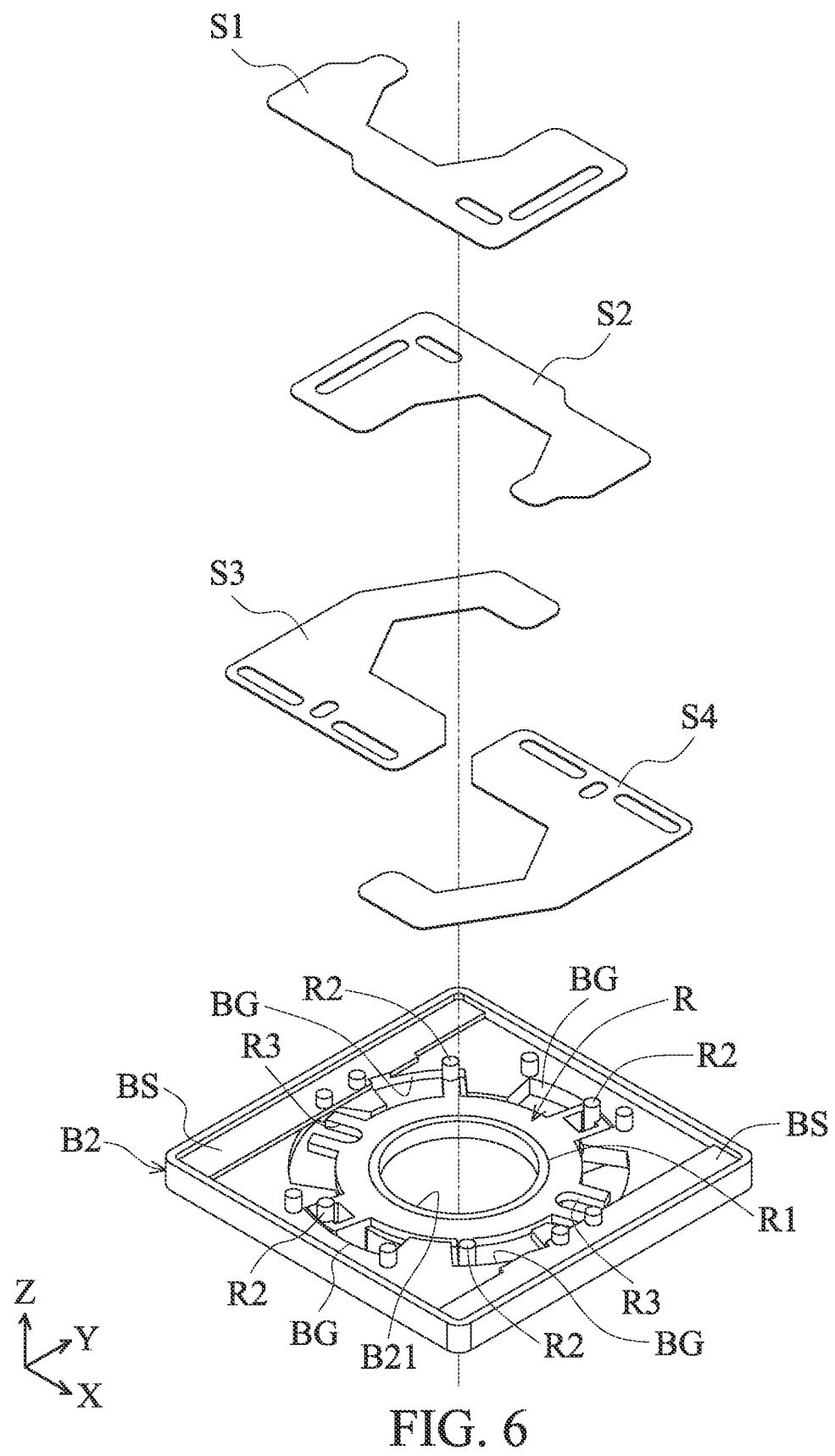
FIG. 6 is an exploded diagram of the upper case B2, the movable member R, and the optical elements S1, S2, S3, and S4 before assembly.
Figure 7:
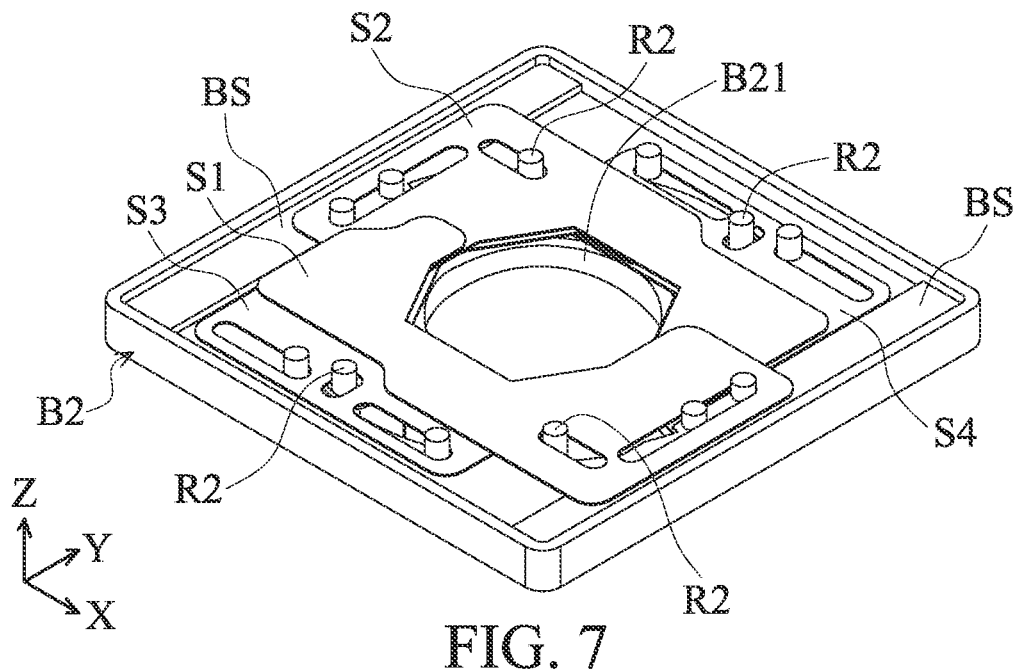
FIG. 7 is a perspective diagram of the upper case B2, the movable member R, and the optical elements S1, S2, S3, and S4 after assembly.
Figure 8:
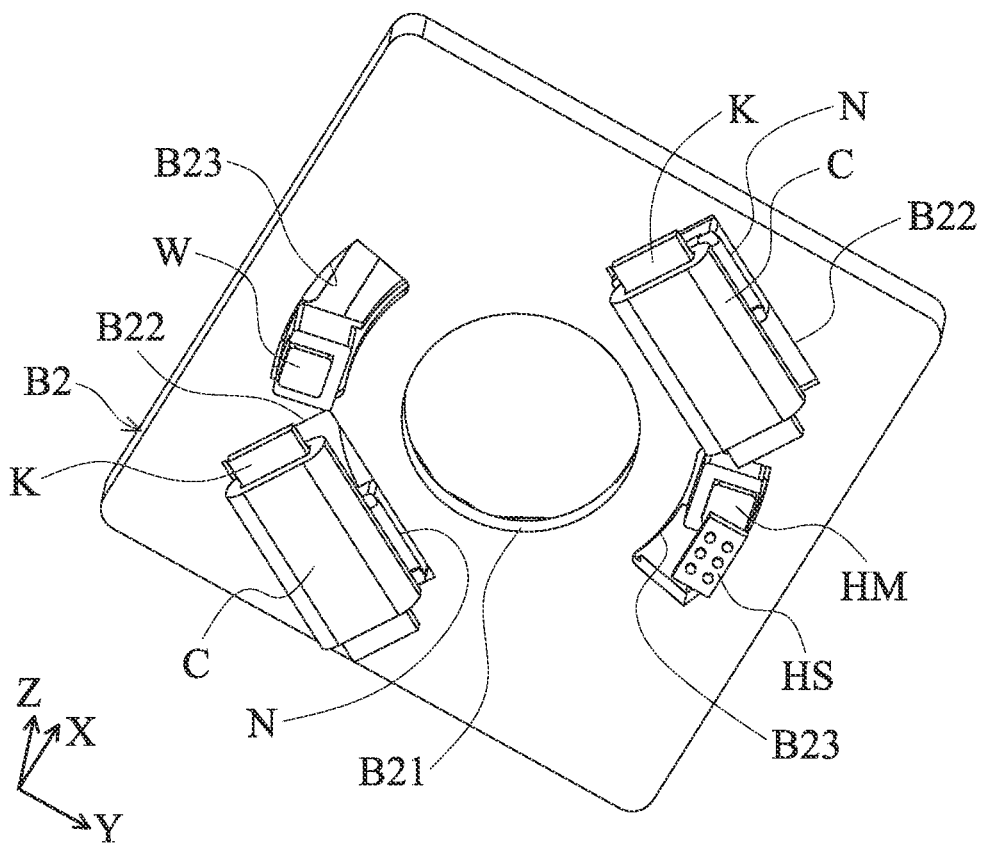
FIG. 8 is a perspective diagram showing the coils C and the yokes K aligned to the upper rectangular openings B22 on the bottom sides of the upper case B2.

FIG. 6 is an exploded diagram of the upper case B2, the movable member R, and the optical elements S1, S2, S3, and S4 before assembly. FIG. 7 is a perspective diagram of the upper case B2, the movable member R, and the optical elements S1, S2, S3, and S4 after assembly. FIG. 8 is a perspective diagram showing the coils C and the yokes K aligned to the upper rectangular openings B22 on the bottom sides of the upper case B2.

Referring to FIGS. 6, 7, and 8, the optical elements S1, S2, S3, and S4 are stacked on the top side of the upper case B2, and two stepped structures BS are formed on opposite sides of the upper case B2. Here, the optical elements S1 and S2 are respectively placed on the two stepped structures BS, and the optical elements S3 and S4 are placed in a depressed region between the two stepped structures BS, wherein the optical elements S1 and S2 do not contact the optical elements S3 and S4.

In this configuration, the thickness of the driving mechanism 100 can be reduced, and frictional interference between the upper optical elements S1 and S2 and the lower optical elements S3 and S4 can be also avoided. Hence, the movable member R can smoothly impel the optical elements S1, S2, S3, and S4 to move relative to the fixed part B along the X axis or the Y axis.

It can be seen in FIG. 6 that two U-shaped structures R3 are formed on opposite sides of the movable member R for receiving the hinges N1 of the sliders N.

Moreover, FIG. 8 shows that two upper rectangular openings B22 and two upper curved openings B23 are formed on the bottom side of the upper case B2. The slider N and the magnetic elements M are movably accommodated in the upper rectangular openings B22, and the coils C and the yokes K are located adjacent to the upper rectangular openings B22. When the current signals are applied to the coils C, the sliders N can be impelled along the upper rectangular openings B22 by electromagnetic forces, and the movable member R can be driven to rotate around the center of the upper case B2.

In this embodiment, the lower rectangular openings B12 are communicated with the upper rectangular openings B22, and the lower curved openings B13 are communicated with the upper curved openings B23.

Still referring to FIG. 8, the magnet HM and the Hall effect sensor HS mounted on the bottom side of the movable member R are both accommodated in the upper curved openings B23 of the upper case B2. The Hall effect sensor HS can be used to detect the displacement of the magnet HM and the movable member R relative to the upper case B2. With the magnet HM and the Hall effect sensor HS accommodated in the upper curved openings B23 after assembly, miniaturization of the driving mechanism 100 can be achieved.

Figure 9:
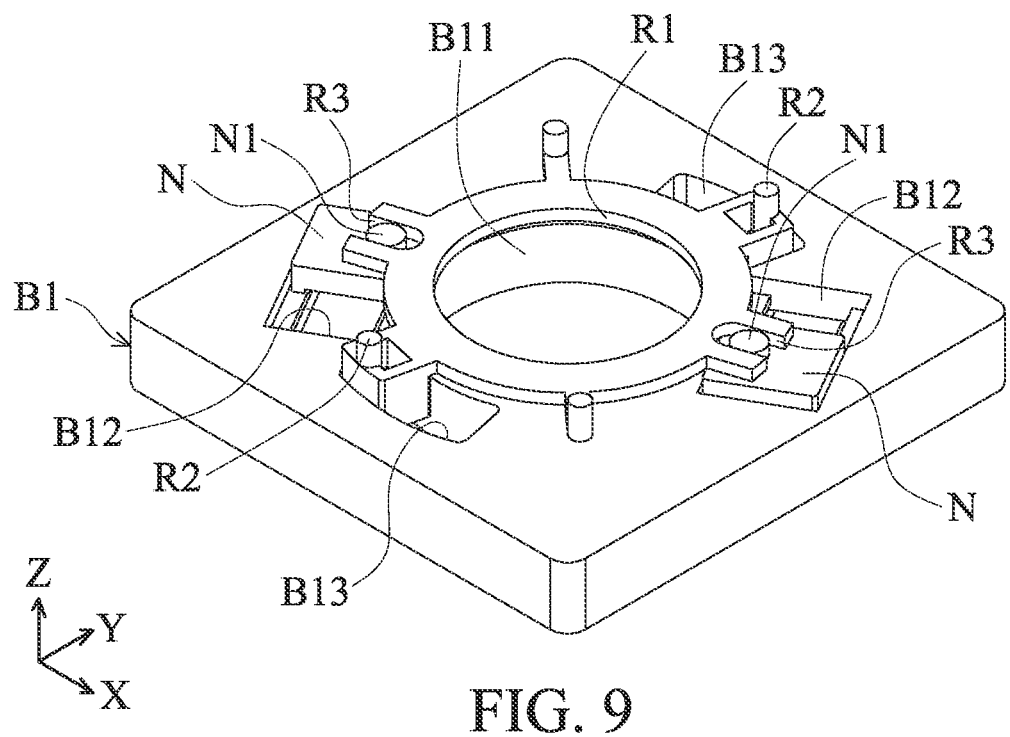
FIG. 9 is a perspective diagram showing the sliders N and the protrusions R2 respectively accommodated in the lower rectangular openings B12 and the lower curved openings B13 of the lower case B1.
Figure 10:
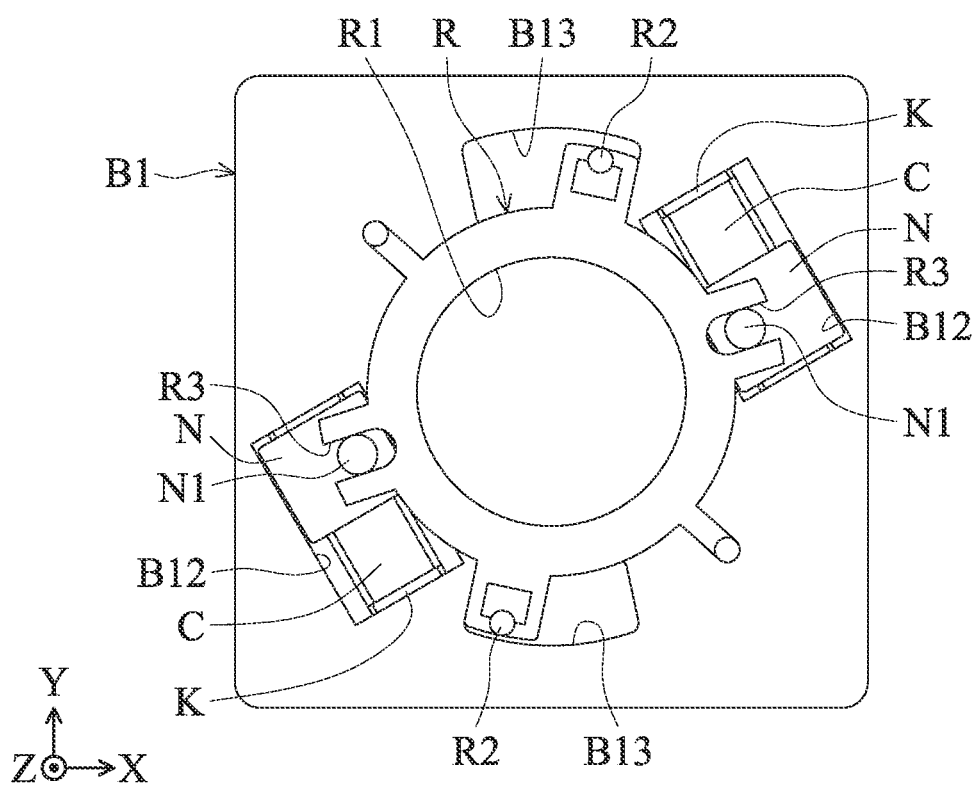
FIG. 10 is a top view of the sliders N and the protrusions R2 that respectively accommodated in the lower rectangular openings B12 and the lower curved openings B13 of the lower case B1.

FIG. 9 is a perspective diagram showing the sliders N and the protrusions R2 respectively accommodated in the lower rectangular openings B12 and the lower curved openings B13 of the lower case B1. FIG. 10 is a top view of the sliders N and the protrusions R2 respectively accommodated in the lower rectangular openings B12 and the lower curved openings B13 of the lower case B1.

Referring to FIGS. 9 and 10, the sliders N and the magnetic elements M on the sliders N extend to the rectangular lower rectangular openings B12 of the lower case B1, and the magnet HM and the block W on the protrusions R2 of the movable member R are both received in the lower curved openings B13 of the lower case B1. The sliders N can be guided by the rectangular lower rectangular openings B12 to move in a linear direction relative to the fixed part B. Additionally, the movable member R can be guided by the lower curved openings B13 to rotate relative to the fixed part B along a curved path.

Figure 11:
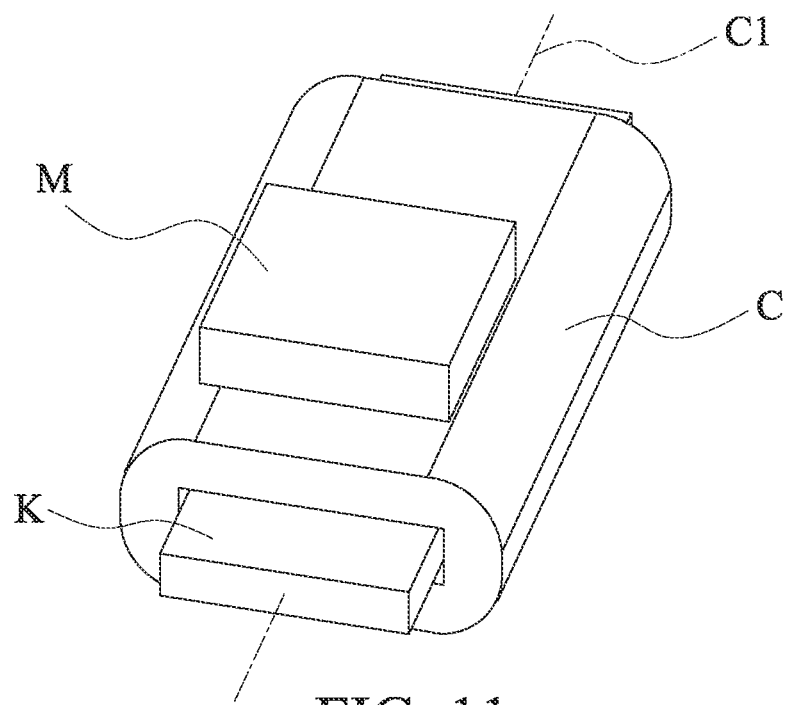
FIG. 11 is a perspective diagram showing the yoke K that is longer than the coil C and the magnetic element M.

FIG. 11 is a perspective diagram showing the yoke K that is longer than the coil C and the magnetic element M.

As shown in FIG. 11, the yoke K extends through the coil C, and the yoke K is longer than the coil C along the central axis C1 of the coil C. In this embodiment, the moving directions of the magnetic elements M and the magnet HM are parallel to the central axis C1, and the polar directions of the magnetic elements M and the magnet HM are parallel to each other and perpendicular to the central axis C1, whereby magnetic interference between the coil C and the magnetic element M (or the magnet HM) can be efficiently avoided.

Moreover, the fixed part B in this embodiment has a quadrilateral structure, the coils C are located adjacent to the corners of the fixed part B, and the central axes C1 of the coils C are angled with respect to one side of the fixed part B (about 30 to 60 degrees). Thus, miniaturization of the driving mechanism 100 can be achieved.

It should be noted that the coil C and the magnetic element M can constitute a driving assembly for impelling the movable member R to rotate relative to the fixed part B. Specifically, the coil C is longer than the magnetic element M along the central axis C1, thereby increasing the moving angle/distance of the movable member R and the magnetic element M and improving the efficiency of the driving mechanism 100.

Since both ends of the yokes K are affixed to the sidewalls in the lower curved openings B12 of the lower case B1, the coils C and the lower case B1 do not contact each other. Hence, the coils C can be protected from being damaged when the fixed part B is impacted by external objects, and accurate positioning between the coils C and the magnetic elements M can be also achieved.

In this embodiment, the driving mechanism 100 includes two driving assemblies and four optical elements S1, S2, S3, and S4. In some embodiments, the driving mechanism 100 may include one driving assembly and one optical element, not limited to the embodiments of the invention described above.

Figure 12:
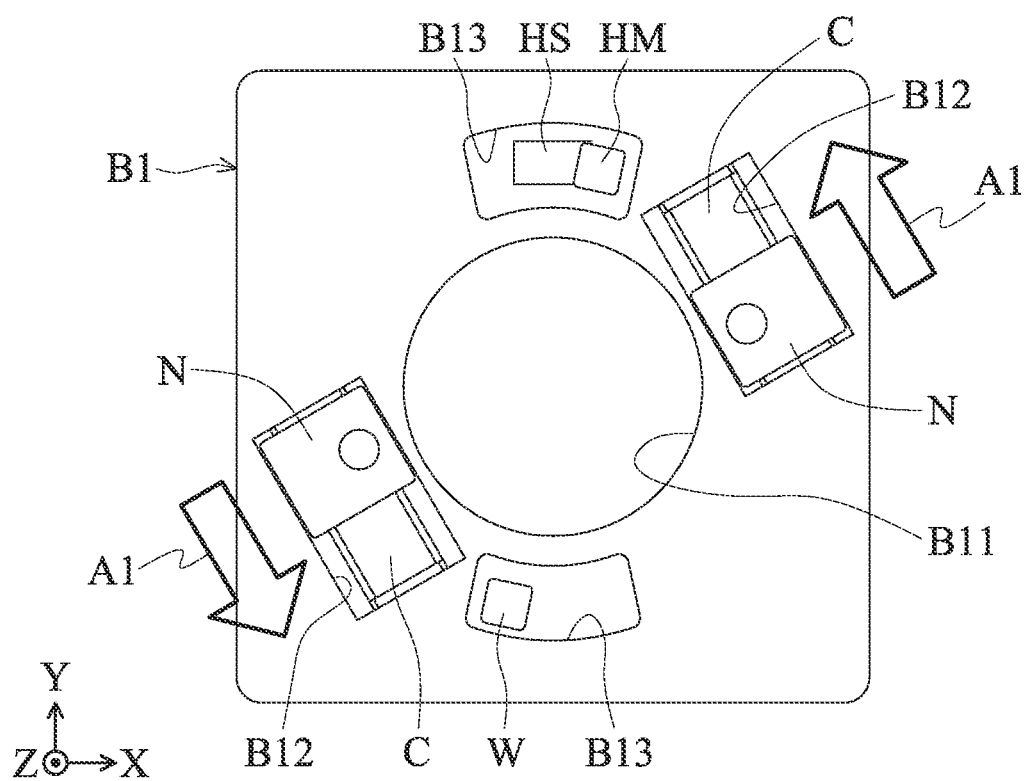
FIG. 12 is a schematic diagram showing the two driving assemblies on opposite sides of the lower case B1 that generate two electromagnetic forces in opposite directions.
Figure 13:
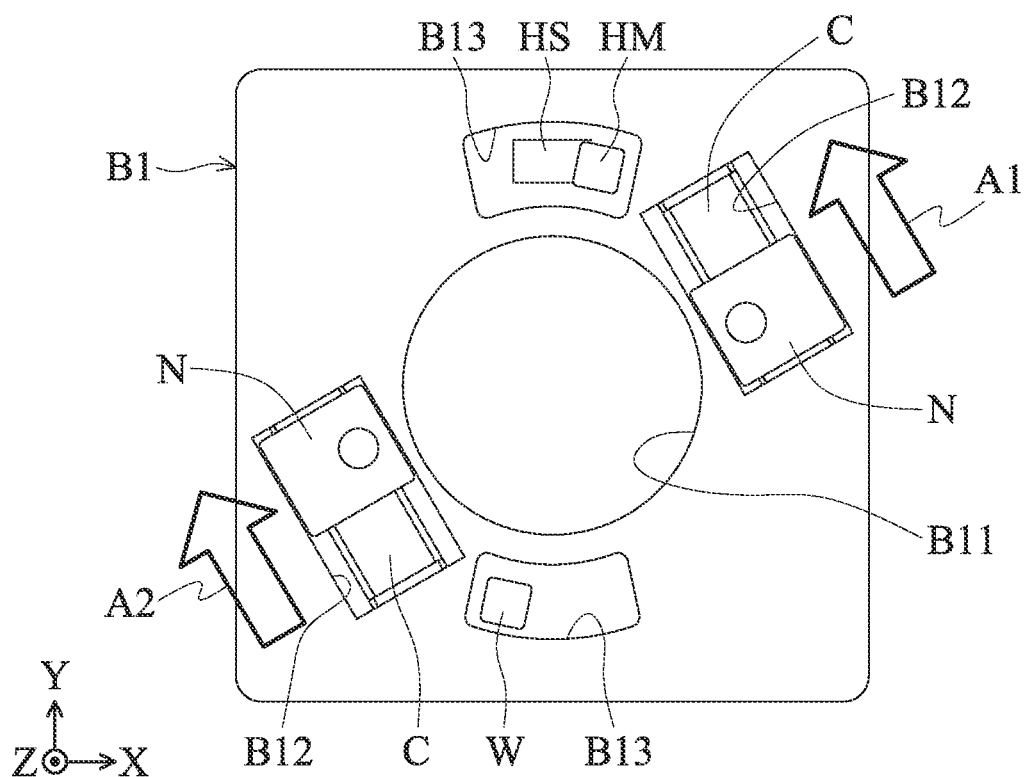
FIG. 13 is a schematic diagram showing the two driving assemblies on opposite sides of the lower case B1 that generate two electromagnetic forces in the same direction.

FIG. 12 is a schematic diagram showing the two driving assemblies on opposite sides of the lower case B1 that generate two electromagnetic forces in opposite directions. FIG. 13 is a schematic diagram showing the two driving assemblies on opposite sides of the lower case B1 that generate two electromagnetic forces in the same direction.

It should be noted that the coils C in this embodiment are electrically connected to the circuit board P by conductive wires, and they can be controlled independently via the circuit board P. As indicated by the arrows in FIG. 12, when two equal current signals are applied to the coils C on opposite sides of the lower case B1, two electromagnetic forces in opposite directions can be generated for rotating the movable member R counterclockwise relative to the fixed part B. Thus, the optical elements S1, S2, S3, and S4 can be driven by the movable member R to move the elative to the fixed part B along the X axis or the Y axis and block the holes H1, R1, B21, and B11.

In contrast, when two equal and opposite current signals are applied to the coils C, two electromagnetic forces in the same direction can be generated to stop the movable member R from rotating relative to the fixed part B, as indicated by the arrows in FIG. 13. Thus, serious collision between the movable member R and the fixed part B can be prevented, thereby achieving accurate positioning and high reliability of the driving mechanism 100.

Figure 14:
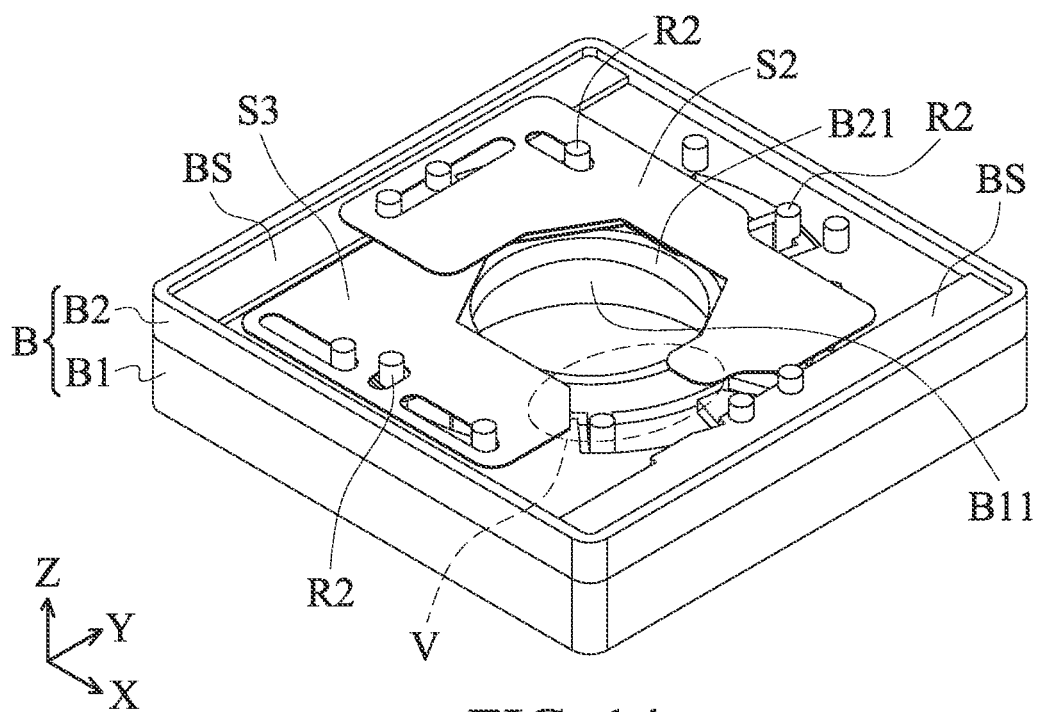
FIG. 14 is a perspective diagram showing an opening V formed between the optical elements S2 and S3.

FIG. 14 is a perspective diagram showing an opening V formed between the optical elements S2 and S3. As shown in FIG. 14, the optical elements S2 and S3 in this embodiment partially overlap when viewed in the Z direction (vertical direction). Specifically, the optical elements S2 and S3 constitute a C-shaped structure, and an opening V is formed between the optical elements S2 and S3 to facilitate miniaturization of the driving mechanism 100.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A driving mechanism for moving a flat optical element, comprising:
    a fixed part;
    a movable member, movably disposed on the fixed part and connected to the optical element;
    a slider, having a hinge pivotally connected to the movable member;
    a driving assembly, configured to impel the movable member and the optical element to move relative to the fixed part, wherein the driving assembly has a coil disposed on the fixed part and a magnetic element disposed on the slider; and
    a yoke, extending through the coil;
    wherein the hinge and the magnetic element are located on opposite sides of the slider, and the polar direction of the magnetic element is perpendicular to a central axis of the coil;
    wherein when a current signal is applied to the coil, the coil and the magnetic element generate an electromagnetic force to impel the slider and the magnetic element in a linear direction relative to the coil, and the movable member is forced to rotate relative to the fixed part along a curved path, wherein the linear direction is parallel to the central axis.

2. The driving mechanism as claimed in claim 1, wherein the yoke is disposed on the fixed part, and the coil and the fixed part do not contact each other.

3. The driving mechanism as claimed in claim 1, wherein the fixed part has a quadrilateral structure, and the central axis of the coil is angled relative to one side of the quadrilateral structure.

4. The driving mechanism as claimed in claim 3, wherein the coil is located adjacent to a corner of the fixed part.

5. The driving mechanism as claimed in claim 1, further comprising two driving assemblies disposed on opposite sides of the movable member.

6. The driving mechanism as claimed in claim 5, wherein the driving assemblies generate two electromagnetic forces in opposite directions.

7. The driving mechanism as claimed in claim 5, wherein the driving assemblies generate two electromagnetic forces in the same direction.

8. The driving mechanism as claimed in claim 1, wherein the driving mechanism is configured to move a plurality of flat optical elements relative to the fixed part, and the fixed part forms a stepped structure and a depressed region adjacent to each other, wherein a first group of the optical elements are disposed on the stepped structure, a second group of the optical elements are disposed in the depressed region, and the first group of the optical elements do not contact the second group of the optical elements.

9. The driving mechanism as claimed in claim 1, wherein the driving mechanism is configured to move a plurality of flat optical elements relative to the fixed part, and the optical elements partially overlap when viewed in a vertical direction, wherein the vertical direction is perpendicular to the optical elements.

10. The driving mechanism as claimed in claim 9, wherein the optical elements constitute a C-shaped structure, and an opening is formed between the optical elements.

11. The driving mechanism as claimed in claim 1, wherein the fixed part includes a lower case and an upper case connected to each other, the movable member is rotatably received in a recess of the upper case, and the optical element is disposed on the movable member.

12. The driving mechanism as claimed in claim 11, wherein the lower case forms a lower rectangular opening and a lower curved opening, and the upper case forms an upper rectangular opening and an upper curved opening, wherein the lower rectangular opening is communicated with the upper rectangular opening, and the lower curved opening is communicated with the upper curved opening.

13. The driving mechanism as claimed in claim 11, wherein the movable member has a protrusion extending through the optical element.

14. A driving mechanism for moving a flat optical element, comprising: a fixed part; a movable member, movably disposed on the fixed part and connected to the optical element; a driving assembly, configured to impel the movable member and the optical element to move relative to the fixed part, wherein the driving assembly has a coil disposed on the fixed part; a slider that has a hinge pivotally connected to the movable member, wherein the driving assembly further has a magnetic element disposed on the slider, and the hinge and the magnetic element are located on opposite sides of the slider; a circuit board; a magnet, disposed on the movable member; and a Hall effect sensor, disposed on the circuit board, wherein the magnet and the Hall effect sensor are accommodated in an opening of the fixed part.

15. The driving mechanism as claimed in claim 14, wherein the polar directions of the magnetic element and the magnet are parallel to each other.

16. The driving mechanism as claimed in claim 14, further comprising a block disposed on the movable member, wherein the magnet and the block are located on opposite sides of the movable member.

\* \* \* \* \*